United States Patent
Ang

(10) Patent No.: US 7,600,139 B2
(45) Date of Patent: Oct. 6, 2009

(54) DYNAMIC BATTERY ADVISOR

(75) Inventor: John Eric Ang, Raleigh, NC (US)

(73) Assignee: Sony Ericsson Mobile Communications AB, Lund (SE)

(*) Notice: Subject to any disclaimer, the term of this patent is extended or adjusted under 35 U.S.C. 154(b) by 468 days.

(21) Appl. No.: 11/387,462

(22) Filed: Mar. 23, 2006

(65) Prior Publication Data

US 2007/0226527 A1 Sep. 27, 2007

(51) Int. Cl.
G06F 1/26 (2006.01)
G06F 1/32 (2006.01)
G06F 11/30 (2006.01)

(52) U.S. Cl. ............... 713/320; 713/300; 713/330; 713/340; 702/176

(58) Field of Classification Search ........... 713/320, 713/300, 330, 340; 702/176
See application file for complete search history.

(56) References Cited

U.S. PATENT DOCUMENTS

| | | | |
|---|---|---|---|
| 6,329,794 B1 | 12/2001 | Oeda | |
| 6,501,968 B1* | 12/2002 | Ichimura | 455/574 |
| 6,807,155 B1* | 10/2004 | Subramanian | 370/252 |
| 6,943,693 B2* | 9/2005 | Kim | 340/636.1 |
| 2003/0074387 A1* | 4/2003 | Tanaka | 709/103 |
| 2003/0229813 A1 | 12/2003 | Shiiyama | |
| 2005/0248317 A1* | 11/2005 | Yang | 320/132 |
| 2007/0011479 A1* | 1/2007 | Pessolano | 713/323 |

FOREIGN PATENT DOCUMENTS

| | | |
|---|---|---|
| EP | 0 459 447 A1 | 12/1991 |
| EP | 1 182 556 | 10/2000 |
| EP | 1 076 395 A2 | 12/2001 |
| GB | 2403377 | 12/2004 |
| JP | 2001-176562 | 6/2001 |

OTHER PUBLICATIONS

International Search Report for corresponding Application No. PCT/US2006/041775 mailed Feb. 22, 2007.

* cited by examiner

Primary Examiner—Thomas Lee
Assistant Examiner—Michael J Brown
(74) Attorney, Agent, or Firm—Renner, Otto, Boisselle & Sklar, LLP

(57) ABSTRACT

An electronic equipment is provided that includes a battery, function circuitry that carries out one or more functions using power drawn from the battery, and a power assessment circuit that assesses power requirements of the function circuitry in relation to a function specified to be performed from among the one or more functions. The electronic equipment further includes a battery monitor circuit that monitors power available from the battery, and a battery advisor circuit, operatively coupled to the power assessment circuit and the battery monitor circuit. The battery advisor provides a recommendation indicative of whether the power available from the battery is sufficient for the function circuitry to carry out the specified function.

18 Claims, 6 Drawing Sheets

DYNAMIC BATTERY ADVISOR

TECHNICAL FIELD OF THE INVENTION

The present invention relates generally to electronic equipment, and more particularly to battery operated electronic equipment capable of carrying out various functions.

DESCRIPTION OF THE RELATED ART

Various types of electronic equipment, such as portable electronic devices, have been popular for decades, and yet continue to increase in popularity. In the communications area, advances in electronic equipment such as digital telephones, mobile phones, pagers, communicators, electronic organizers, personal digital assistants (PDAs), smartphones, etc. have made it possible for seemingly everyone to own one or more different devices.

Many types of electronic equipment, and especially portable electronic devices, operate on battery power. Such battery operated electronic equipment includes replaceable and/or rechargeable batteries that initially may be charged to full capacity. However, the batteries tend to lose their charge as a result of use of the electronic equipment and/or due to leakage current when not in use. Consequently, users are frequently replacing or recharging the batteries in order to enjoy continued use of the electronic equipment.

In order to avoid a user of the electronic equipment becoming seriously inconvenienced by a loss of battery power, battery level indicators of some type have conventionally been provided in the electronic equipment. For example, mobile phones typically include a battery level indicator shown within a display. The strength (i.e., level of electrical charge) typically is represented by a corresponding number of "bars". The higher the number of bars the display shows, the greater the strength of the battery. Such battery level indicators are useful for indicating the approximate amount of charge left in the battery (e.g., whether the battery is full, half-full, quarter-full, etc.). However, the battery level indicators do not provide much guidance with respect to how much operating time of the electronic equipment remains based on the remaining battery charge. The user must approximate remaining operating time in his or her head based on past experience.

Portable computers frequently include a more advanced battery level indicator. In addition to indicating the relative proportion of battery charge remaining (e.g., number of bars), many portable computers also provide an indication of the remaining operating time of the computer based on the remaining battery charge. While an indication of the remaining operating time is more useful than the battery charge level alone, there remain problems with such battery level indicators. For example, the remaining operating time is largely dependent upon the amount of current drawn by the computer. The amount of current drawn by the computer is largely dependent upon the particular functions the computer is required to perform. For example, functions requiring rapidly changing graphics, substantial computations, constant access to the hard drive, etc., draw considerably more current than simple word processing, etc. Thus, the remaining operating time as displayed by the computer battery level indicator will change depending on the particular functions performed by the computer.

Such conventional display of the battery level indicator can be disadvantageous in that the impact a new function will have on the remaining operating time cannot be known by the user until the new function is performed. Moreover, the user will not necessarily know if the remaining operating time will be sufficient to complete the function. For example, a user may wish to use a mobile phone or portable computer to receive and view a streamcast video via a pay service. The amount of remaining operating time displayed in the battery level indicator before the streamcast begins can change substantially after the mobile phone or portable computer begins to reproduce the streamcast video. In fact, the user may find that although the mobile phone or portable computer previously indicated sufficient battery power for a thirty minute streamcast, for example, there is only sufficient battery power for fifteen minutes of streamcast once the streamcast has begun. Consequently, the battery of the mobile phone or portable computer may not hold sufficient charge to complete the streamcast, even though the user may have already been charged for the streamcast.

In view of the aforementioned shortcomings associated with conventional battery level indicators, there is a strong need in the art for a battery monitor that reduces or avoids the risk of a user overestimating the remaining operating time based on a displayed level of battery charge. Moreover, there is a strong need in the art for a battery monitor that reduces or avoids the risk of a mobile phone, portable computer, or other type of electronic equipment running out of battery power before the completion of a function (e.g., the viewing of a streamcast video).

SUMMARY

According to an aspect of the present invention, an electronic equipment is provided that includes a battery, function circuitry that carries out one or more functions using power drawn from the battery, and a power assessment circuit that assesses power requirements of the function circuitry in relation to a function specified to be performed from among the one or more functions. The electronic equipment further includes a battery monitor circuit that monitors power available from the battery, and a battery advisor circuit, operatively coupled to the power assessment circuit and the battery monitor circuit. The battery advisor provides a recommendation indicative of whether the power available from the battery is sufficient for the function circuitry to carry out the specified function.

According to another aspect, the power assessment circuit assesses the power requirements of the specified function as a function of a predefined time duration of the specified function.

In accordance with another aspect, the time duration is estimated.

In accordance with still another aspect, the time duration is estimated based on an evaluation of past time durations of same or similar functions with respect to the specified function.

According to yet another aspect, the evaluation is based on an averaging of the past time durations of the same or similar functions.

In yet another aspect, the power assessment circuit assesses the power requirements of the specified function as a function of a predefined power consumption characteristic associated with the specified function.

In accordance with still another aspect, the predefined power consumption characteristic comprises an estimated power consumption rate.

According to another aspect, the estimated power consumption rate is estimated based on an evaluation of past power consumption rates of same or similar functions with respect to the specified function.

With yet another aspect, the evaluation comprises averaging the past power consumption rates of the same or similar functions.

In accordance with another aspect, the predefined power consumption characteristic comprises an estimated power consumption.

According to another aspect, the estimated power consumption is estimated based on an evaluation of past power consumption of same or similar functions with respect to the specified function.

According to yet another aspect, the evaluation comprises averaging past power consumption of the same or similar functions.

In yet another aspect, the electronic equipment further comprises a memory for storing at least one of time duration information or power consumption characteristic information in relation to the one or more functions.

According to another aspect, the specified function comprises reproducing a video file.

In accordance with another aspect, the video file comprises a streaming video file.

In accordance with still another aspect, the power assessment circuit assesses the power requirements of the function circuitry in relation to reproducing the video file based on time duration information provided with the video file.

According to another aspect, the power assessment circuit assesses the power requirements of the function circuitry in relation to reproducing the video file based further on predefined power consumption rate information associated with the function circuitry when reproducing video files.

According to still another aspect, the specified function comprises reproducing an audio file.

In accordance with another aspect, the specified function comprises capturing video.

With yet another aspect, the specified function comprises providing game play.

According to still another aspect, the electronic equipment is a mobile phone.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

It should be emphasized that the term "comprises/comprising" when used in this specification is taken to specify the presence of stated features, integers, steps or components but does not preclude the presence or addition of one or more other features, integers, steps, components or groups thereof.

DETAILED DESCRIPTION OF EMBODIMENTS

Figure 1:
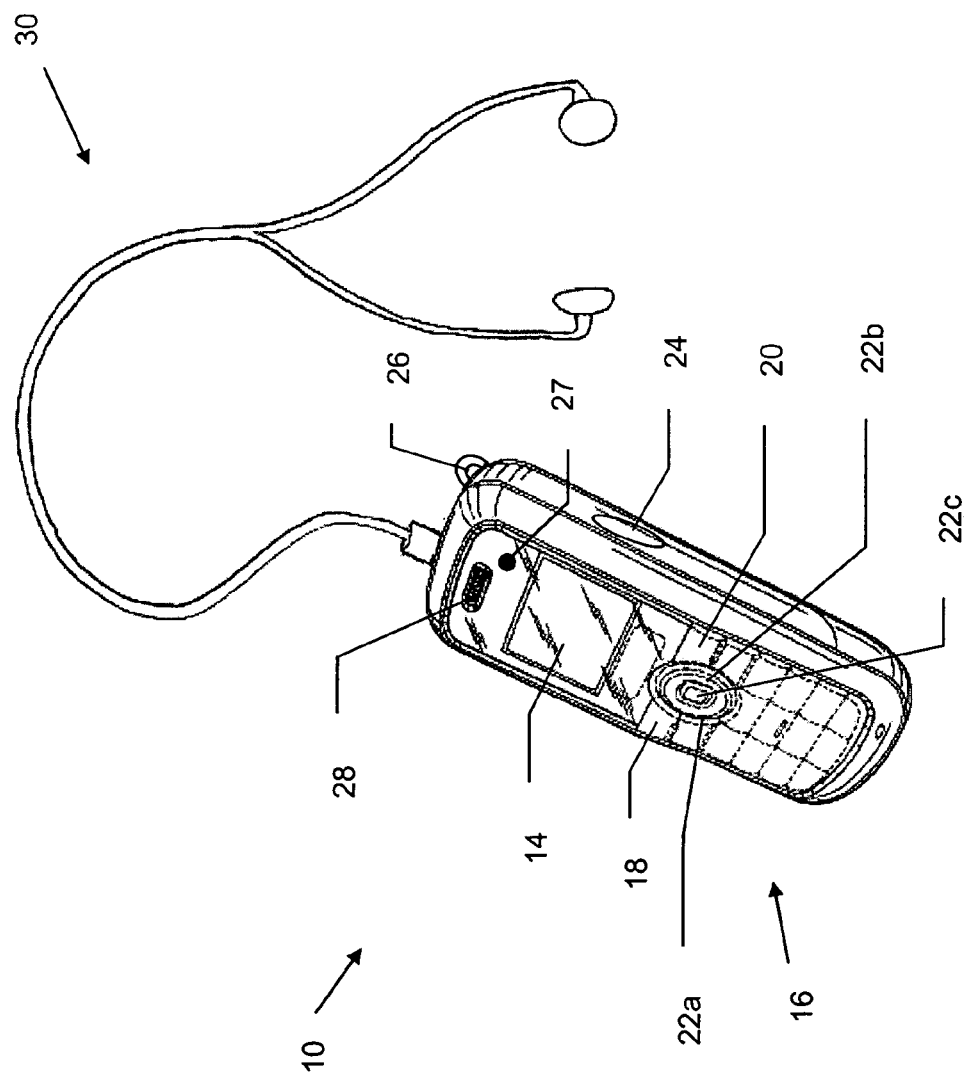
FIG. 1 is a schematic view of a mobile phone as an exemplary electronic equipment in accordance with an embodiment of the present invention.

The present invention will now be described with reference to the drawings, wherein like reference numerals are used to refer to like elements throughout.

The term "electronic equipment" as referred to herein includes portable electronics and other types of electronics that can operate on battery power. The term "portable electronics" includes all portable electronic equipment such as portable computers, mobile phones, pagers, communicators, electronic organizers, personal digital assistants (PDAs), smartphones or the like. "Electronic equipment" as referred to herein also includes personal electronics, including, but not limited to, media players of various formats such as digital music players (e.g., CD, MP3, AC-3, .wma, etc.), video players (e.g., DVD, MPEG, .wmv, etc.), picture players (e.g., JPEG, etc.). In the present application, the invention is described primarily in the context of a mobile phone. However, one will appreciate that the invention is not intended to be limited to a mobile phone and can be any type of electronic equipment.

Referring initially to FIG. 1, an electronic equipment 10 is shown in accordance with the present invention. In the exemplary embodiment described herein, the electronic equipment is a battery-operated mobile phone 10. The mobile phone 10 is shown as having a "brick" or "block" design type housing, but it will be appreciated that other type housings such as clamshell or slide-type housings may be utilized without departing from the scope of the invention.

The mobile phone 10 includes a display 14 and keypad 16. As is conventional, the display 14 displays information to a user such as operating state, time, phone numbers, contact information, various navigational menus, etc., which enable the user to utilize the various features of the mobile phone 10. Similarly, the keypad 16 may be conventional in that it provides for a variety of user input operations. For example, the keypad 16 typically includes alphanumeric keys for allowing entry of alphanumeric information such as telephone numbers, phone lists, contact information, notes, etc. In addition, the keypad 16 typically includes special function keys such as a "call send" key 18 for initiating or answering a call, and a "call end" key 20 for ending, or "hanging up" a call. Special function keys may also include menu navigation keys 22a, 22b and 22c, for example, for navigating through a menu displayed on the display 14 to select different phone functions, profiles, settings, etc., as is conventional. Other keys included in the keypad 16 may include a volume key 24, on/off power key 26, as well as various other keys such as a web browser launch key, camera key, etc.

In the particular embodiment of FIG. 1, the mobile phone 10 includes the display 14 and separate keypad 16. In an alternative embodiment, the display 14 may comprise a touchscreen which itself includes one or more keys. In yet another embodiment, the display 14 may comprise a touchscreen that includes all or substantially all of the keys used to operate the phone 10 so as to include a very limited keypad 16 or no keypad 16 at all. As will be appreciated, the particular form and function of the keys included in the keypad 16 or touchscreen/display 14 are not germane to the invention in its broadest sense. The mobile phone 16 further includes a camera lens 27 that is part of a camera feature commonly found in mobile phones today.

As will be described in more detail below, the mobile phone 10 is a multi-functional device that is capable of carrying out various functions in addition to traditional mobile phone functions. For example, the mobile phone 10 in accordance with the present invention also functions as a media player. More specifically, the mobile phone 10 is capable of playing different types of media objects such as audio files (e.g., MP3, .wma, AC-3), video files (e.g., MPEG, .wmv, etc.), still images (e.g., .pdf, JPEG, .bmp, etc.). The media objects may be downloaded and stored in non-volatile memory within the mobile phone 10. Alternatively, the media objects may be received and displayed substantially in real time as a result of a streamcast protocol (e.g., real time streaming protocol (RTSP)) over a mobile phone network, for example. The mobile phone 10 reproduces audio files through a speaker 28 or an accessory such as stereo headphones 30 which may be plugged into the mobile phone 10 via an appropriate connector. The mobile phone 10 is capable of reproducing video or other image files on the display 14, for example.

For reasons explained more fully below, the mobile phone 10 overcomes the aforementioned shortcomings associated with existing battery-operated electronic equipment. The mobile phone 10 includes function circuitry that allows the mobile phone 10 to carry out one or more functions, including, for example, watching a video, playing a game, capturing a video, listening to an album, conducting a telephone call, etc. The mobile phone 10, including the function circuitry, operates on power drawn from a battery also included within the mobile phone 10. The mobile phone 10 further includes a power assessment circuit that assesses power requirements of the function circuitry. In particular, the power assessment circuit assesses the power required from the battery in order for the mobile phone 10 to perform a function specified from among the one or more functions. For example, if a user chooses to view a streamed video, the power assessment circuit will assess the amount of battery power required by the mobile phone 10 in order to complete the function of viewing the streamed video. A battery monitor circuit included in the mobile phone 10 monitors power available from the battery and a battery advisor circuit, operatively coupled to the power assessment circuit and the battery monitor circuit, provides a recommendation indicative of whether the power available from the battery is sufficient for the function circuitry to carry out the specified function. In such manner, the mobile phone 10 reduces the risk of a user overestimating the remaining operating time based on a displayed level of battery charge. Moreover, the mobile phone 10 reduces the risk of running out of battery power before the completion of the viewing of the streamed video.

Figures 2A, 2B:
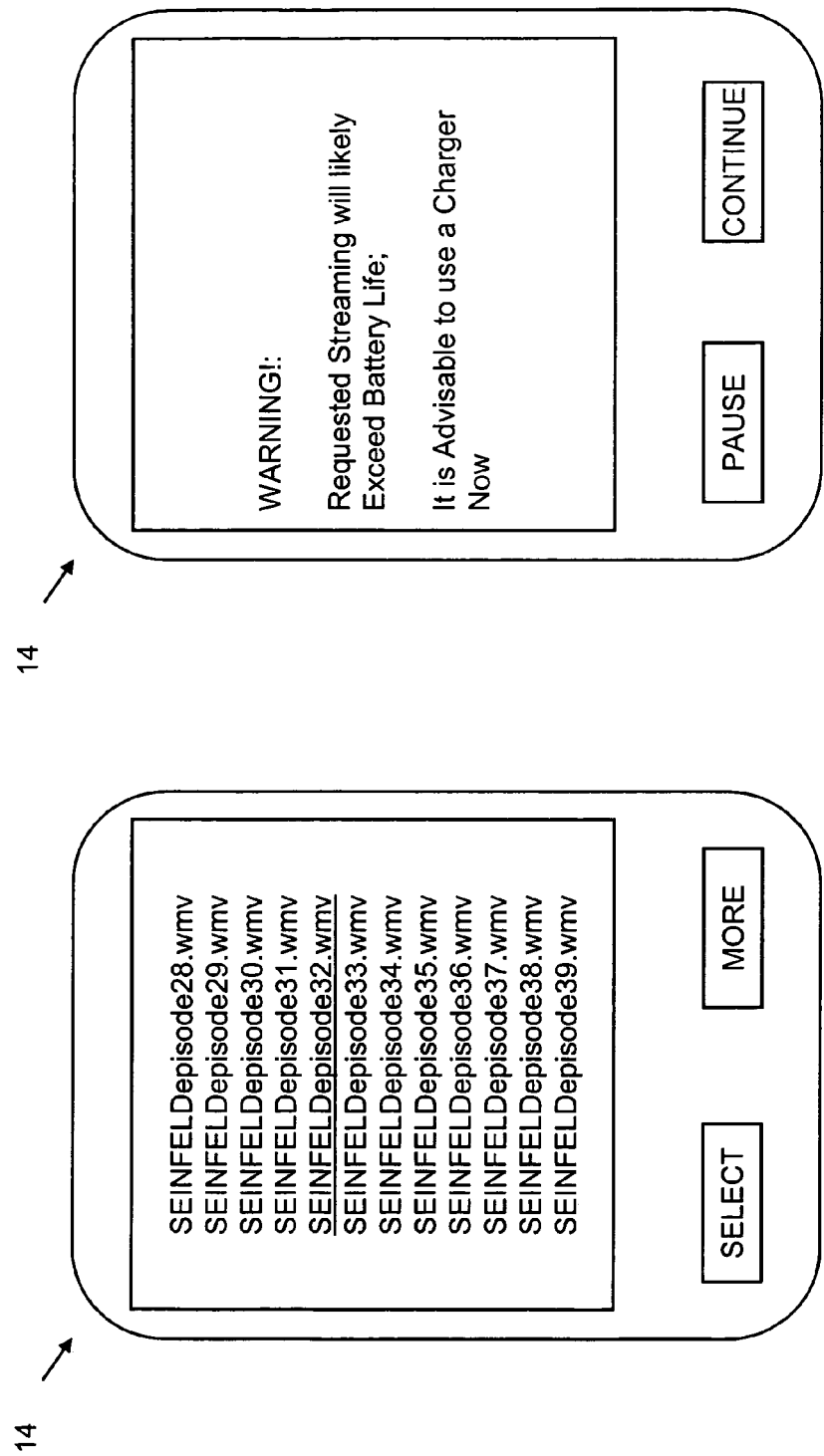
FIGS. 2A and 2B illustrate exemplary graphical user interface screen displays on the mobile phone of FIG. 1 in accordance with an embodiment of the present invention.

Referring to FIGS. 2A and 2B as an example, FIG. 2A illustrates the display 14 on the mobile phone 10 in a case where the user is interested in viewing a streamcast video available via a commercial service over a mobile phone network. As is shown in FIG. 2A, the user is presented with a variety of options as far as videos available for watching. The user may select one of the videos for streamcasting by highlighting the selection via the navigation keys, for example. According to the present invention as described more fully below, the mobile phone 10 then proceeds to set up the streamcast with the streamcast server. As part of the setup protocol of the streamcast, the mobile phone 10 receives information regarding the selected video such as running time (i.e., duration), encoding method (e.g., mpeg, .wmv, etc.). Using such information, the mobile phone 10 compares whether the charge available in the battery is sufficient to perform the function of viewing the streamcast video. For example, the mobile phone 10 may compare the time remaining with respect to the battery charge to the duration of the streamcast video. If the time remaining with respect to the battery charge is less than the streamcast video duration, the power available from the battery is not sufficient for the function circuitry to carry out the specified function. Consequently, the mobile phone 10 presents an advisory on the display 14 such as shown in FIG. 2B. The advisory indicates that the battery charge is not likely to be sufficient to allow the user to view the entire streamcast. The user is advised to use a battery charger coupled to the mobile phone 10 if the user wishes to continue to view the streamcast video. Alternatively, the user may pause or cancel the video viewing.

Accordingly, the present invention helps to avoid a user selecting to view a streamcast video only to run out of battery power prior to completing the streamcast video. In a system in which the user is not charged for a streamcast video until streaming has fully begun (e.g., occurred for at least a predetermined time such as three minutes), the user avoids being charged for an incomplete video viewing. As will be further described below, the power assessment circuit may assess the amount of power required for carrying out the selected function based on characteristics different from or in addition to duration. For example, measured power consumption, estimated power consumption, estimated duration, etc., may be considered as well.

Figure 3:
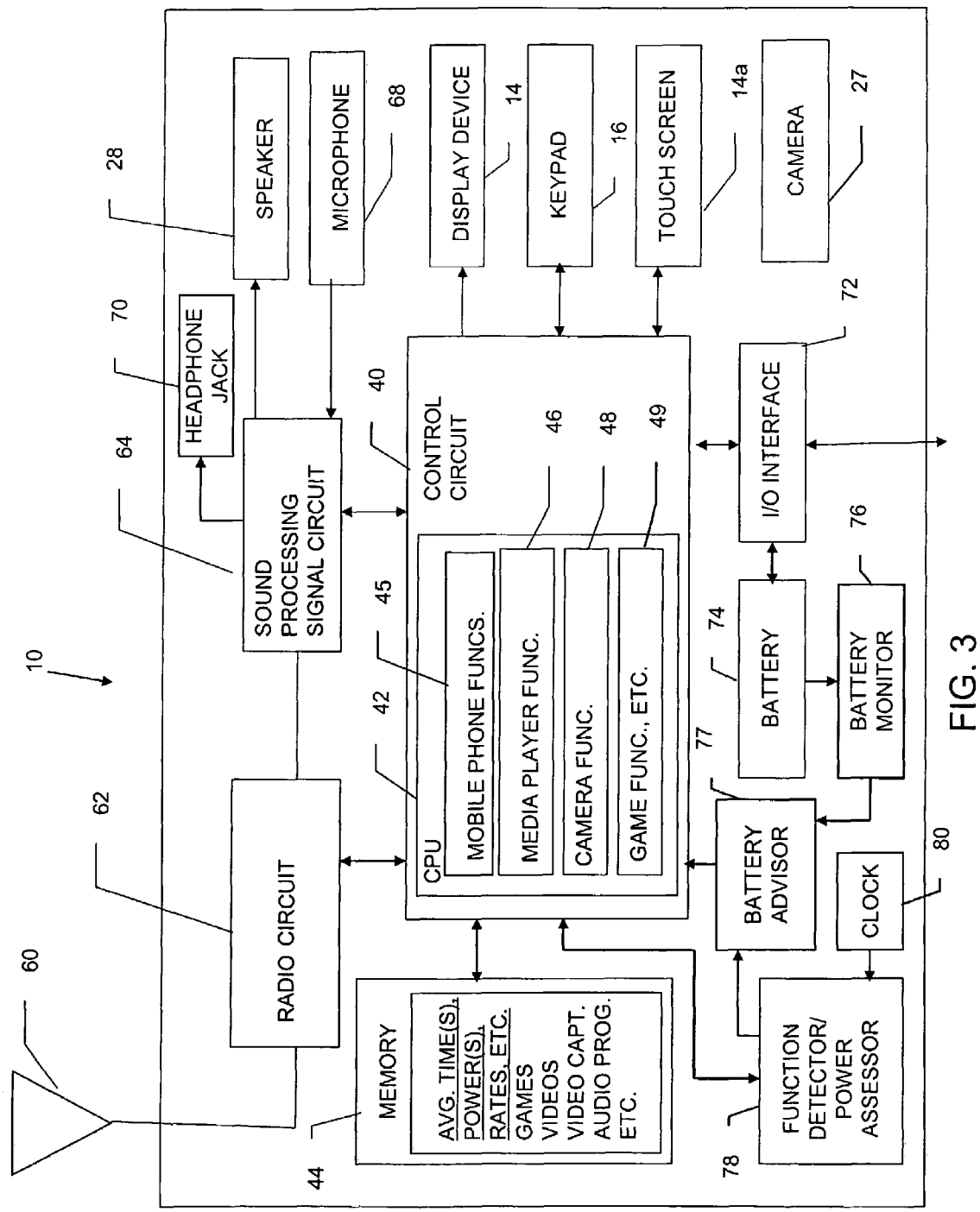
FIG. 3 is a schematic block diagram of the relevant portions of the mobile phone of FIG. 1 in accordance with an embodiment of the present invention.

FIG. 3 represents a functional block diagram of the mobile phone 10. The construction of the mobile phone 10 is generally conventional with the exception of the battery advisory operations described herein. Preferably, the battery advisory operations are implemented primarily via application software within the mobile phone 10. However, it will be apparent to those having ordinary skill in the art that such operations can be carried out via primarily software, hardware, firmware, or combinations thereof, without departing from the scope of the invention. The terms "circuit" and "circuitry" as referred to herein refer to software, hardware, firmware, or any combination thereof.

The mobile phone 10 includes a primary control circuit 40 that is configured to carry out overall control of the functions and operations of the mobile phone 10. The control circuit 40 may include a CPU, microcontroller, or microprocessor, etc., collectively referred to herein simply as a CPU 42. The CPU 42 executes code stored in memory (not shown) within the control circuit 40 and/or in a separate memory 44 in order to carry out conventional operation of the mobile phone functions 45 within the mobile phone 10. In addition, however, the CPU 42 executes code stored in the memory 44 in order to perform battery advisory operations in accordance with the present invention.

FIG. 3 illustrates how the mobile phone 10 may be configured to carry out one or more functions in addition to the conventional mobile phone functions 45. For example, the CPU 42 is programmed to operate as a media player 46 with different types of media (e.g., video and audio files) as outlined above. Moreover, the CPU 42 may be programmed to enable the mobile phone to operate with a camera function 48. As is relatively well known, mobile phones 10 now include the capability of taking pictures and/or capturing video clips and saving them in memory 44. Furthermore, the CPU 42 may be programmed to enable the mobile phone 10 to operate as a gaming device (i.e., with game function) 49. Games may be stored in memory 44 and/or obtained via the mobile phone network typically via a commercial service as is known.

As is explained in more detail below with respect to FIGS. 4-6, the memory 44 also preferably includes various power consumption characteristics and data used in the battery advisory operations. For example, the memory 44 may be used to store and maintain duration times of different types of functions (e.g., game play, video watching, video capture, audio listening, telephone calling, etc.). Some functions may have a set and precisely defined duration, such as the known duration of any video or audio files stored in the memory 44. If a user chooses to view any video file or listen to any audio file stored in the memory 44, the mobile phone 10 may extract the precise duration time from within the respective files as is known. Alternatively, some functions may have an estimated duration stored in the memory 44. For example, each time the user of the mobile phone 10 plays a game included among the game features in the telephone 10, the mobile phone 10 calculates a revised average duration time of the particular game and stores the revised average in the memory 44. Such average duration time may be saved for each different game available on the mobile phone 10. Similarly, the mobile phone 10 may be equipped with a camera for capturing video. The mobile phone 10 is configured to calculate an estimated duration of a video capture function based on the average duration of video captures performed by the user. The average duration is then stored in the memory 44 as the predefined duration of a video capture function.

Similarly, the mobile phone 10 may be configured to keep track of the average amount of power required for various different functions performed by the mobile phone 10. For example, each time the user chooses to play a particular game, the mobile phone 10 monitors the power consumption and uses the measured power consumption to calculate an average power consumption representative of the average amount of power consumed from the battery each time the user plays the particular game. Power consumption may be monitored using conventional techniques such as, for example, monitoring the current drain per unit time. In addition, or in the alternative, the mobile phone 10 may be configured to store and maintain other power consumption characteristics in the memory 44 such as the operating current drain rate. Again, the specific rates may be based on actual or averaged values, for example. As a specific example, it may be known that the mobile phone 10 draws current at a specific current drain rate in the case of decoding an mpeg encoded video file, and draws current at a different specific current drain rate in the case of decoding a .wmv encoded video file.

A person having ordinary skill in the art of computer programming and specifically in applications programming for mobile phones will consider it obvious in view of the description provided herein how to program a mobile phone 10 to operate and carry out the functions described herein. Accordingly, details as to the specific programming code have been left out for sake of brevity. Also, while the battery advisory operations may be carried out via the CPU 42 and application software in the memory 44 in accordance with the preferred embodiment of the invention, such functions could also be carried out via dedicated hardware, firmware, software, or combinations thereof, without departing from the scope of the invention.

Continuing to refer to FIG. 3, the mobile phone 10 includes an antenna 60 coupled to a radio circuit 62. The radio circuit 62 includes a radio frequency transmitter and receiver for transmitting and receiving signals via the antenna 60 as is conventional. The mobile phone 10 further includes a sound processing circuit 64 for processing the audio signal transmitted by/received from the radio circuit 62. In addition, the sound processing circuit 64 serves to process the audio signal provided by the control circuit 40 during playback of media objects. Coupled to the sound processing circuit 64 are the aforementioned speaker 28, and a microphone 68 which enable a user to listen and speak via the mobile phone 10 as is conventional. In addition, a headphone jack 70 coupled to the sound processing circuit 64 is provided. This allows the headset 30 to be connected to the mobile phone 10. Thus, when functioning as a media player the mobile phone 10 may direct audio to the speaker 28 and/or the headset 30 via the sound signal processing circuit 64. The radio circuit 62 and sound processing circuit 64 are each coupled to the control circuit 40 so as to carry out overall operation.

The mobile phone 10 also includes the aforementioned display 14 and keypad 16 coupled to the control circuit 40. In the case where all or part of the display 14 comprises a touchscreen, such operation may be represented by the touchscreen 14a in FIG. 1. The mobile phone 10 further includes an I/O interface 72. The I/O interface 72 may be in the form of any one of many typical mobile phone I/O interfaces, such as a multi-element connector at the base of the mobile phone 10. As is typical, the I/O interface 72 may be used to couple the mobile phone 10 to a battery charger. The battery charger charges a battery 74 included in the mobile phone 10 for providing operating power to the mobile phone. In addition, or in the alternative, the I/O interface 72 may serve to connect the mobile phone 10 to a wired personal hands-free adaptor (not shown) or Bluetooth adaptor (also not shown) for use with a Bluetooth-based hands-free adaptor. Further, the I/O interface 72 may serve to connect the mobile phone 10 to a personal computer or other device via a data cable, etc. As another alternative, the I/O interface 72 may serve to connect the mobile phone 10 to a docking station including an audio amplifier, speakers and/or video display to allow for enhanced viewing/listening of the media objects as part of the media player function.

In accordance with the exemplary embodiment of the present invention, the mobile phone 10 includes a battery monitor 76 that monitors the power or charge available from the battery 74 at a given time. Typically such power level is measured in terms of state of charge estimates using conventional techniques. The particular technique utilized by the battery monitor 76 in conjunction with the present invention can be any known technique without departing from the scope of the invention. Based on the measured remaining charge, the battery monitor 76 provides an output that can take on a variety of formats. For example, the output may represent the amount of remaining charge. In addition, or in the alternative, the output of the battery monitor 74 may be represented as an estimated time remaining before the battery 74 runs out of charge. Such estimate may be based on the amount of remaining charge versus the current consumption rate as may also be detected by the battery monitor 76 using conventional techniques. Alternatively, the output of the battery monitor 76 may be in terms of the number of ampere-hours remaining in the battery 74, etc. The output of the battery monitor 76 is provided to a battery advisor 77 also included in the mobile phone 10 as will be explained in more detail below.

The mobile phone 10 further includes a function detector/power assessment circuit 78 that serves to detect a specified function to be performed. For example, the function detector/power assessment circuit 78 determines a particular function to be performed as specified by the user via the keypad 16.

The specified function may be viewing a streamcast video as discussed above in relation to FIGS. 2A and 2B. Alternatively, the specified function may be making a call via the mobile phone function 45, listening to an album or playlist of audio tracks via the media player function 46, capturing a video sequence via the camera function 48, playing a particular game via the game function 49, etc. In the broadest sense, the present invention is not limited to any particular function. Moreover, in most cases the user will specify a function to be performed via the keypad 16. However, other methods may be used to specify the function. Moreover, the function need not be specified by the user and instead may be specified automatically via a preprogrammed activity within the mobile phone 10 itself, for example.

In addition to detecting the specified function, the function detector/power assessment circuit 78 also assesses the power requirements of the function circuitry within the mobile phone 10 in order to perform the specified function. Specifically, the function detector/power assessment circuit 78 detects the specified function and then ascertains the power requirements for performing the specified function based on power consumption characteristics available from the audio/video files to be reproduced; power consumption characteristics based on empirical data such as average times, consumption, rates, etc. computed by the function detector/power assessment circuit 78 and stored in the memory 44; power consumption characteristics available over the mobile phone network in association with a given specified function, etc.

As noted above, the memory 44 may be used to store and maintain duration times of different types of functions (e.g., game play, video watching, video capture, audio listening, telephone calling, etc.). Some functions may have a set and precisely defined duration, such as the known duration of any video or audio files stored in the memory 44. If a user chooses to view any video file or listen to any audio file or playlist stored in the memory 44, for example, the mobile phone 10 may extract the precise duration time from within the respective files as is known.

As also noted above, some functions alternatively may have an estimated duration stored in the memory 44. The mobile phone 10 includes a clock 80 that, in conjunction with the function detector/power assessor 78 creates a table entry of power consumption characteristic(s) in the memory 44 for each function that may be carried out by the mobile phone 10. Each time the user of the mobile phone 10 requests a specific function (e.g., plays a game included among the game features in the telephone 10), the function detector/power assessor 78 calculates a revised average duration time of the specific function (e.g., the particular game) based on the measured time and stores the revised average in the memory 44. Such average duration time may be saved for each different function (e.g., game) available on the mobile phone 10. Similarly, the mobile phone 10 may be equipped with a camera for capturing video. The function detector/power assessor 78 is configured to calculate an estimated duration of a video capture function based on the average duration of video captures performed by the user in the past. The average duration is then stored in the memory 44 as the predefined duration of a video capture function.

Further, as noted above the function detector/power assessor 78 may be configured to keep track of the average amount of power required for various different functions performed by the mobile phone 10. For example, each time the user chooses to play a particular game, the function detector/power assessor 78 monitors the power consumption in conjunction with the battery monitor 76 and uses the measured power consumption to calculate an average power consumption representative of the average amount of power consumed from the battery 74 each time the user plays the particular game. Power consumption may be monitored using conventional techniques such as, for example, monitoring the current drain per unit time. In addition, or in the alternative, the function detector/power assessor 78 may be configured to store and maintain other power consumption characteristics in the memory 44 such as the operating current drain rate. Again, the specific rates may be based on actual or averaged values, for example. As a specific example, it may be known that the mobile phone 10 draws current at a specific current drain rate in the case of decoding an mpeg encoded video file, and draws current at a different specific current drain rate in the case of decoding a .wmv encoded video file.

The present invention contemplates the function detector/power assessment circuit 78 assessing the power requirements for performing a specified function according to any of a variety of methods, only some of which are described herein for sake of brevity.

The function detector/power assessor 78 provides an output to the battery advisor 77 indicative of the power requirements for performing the specified function. The battery advisor 77 is configured to compare the output of the function detector/power assessor 78 with the output of the battery monitor 76 to provide a recommendation indicative of whether the power available from the battery is sufficient for the function circuitry within the mobile phone 10 to carry out the specified function. Thus, for example, if the battery monitor 76 indicates that 45 minutes of charge is remaining in the battery 74 and a specified function has an average duration of 20 minutes as noted by the function detector/power assessor 78, the battery monitor 76 concludes that there is sufficient power available from the battery 74 to perform the specified function. On the other hand, if the battery monitor 76 indicates that there is 10 minutes of charge remaining in the battery 74 and the average duration of the specified function is still 20 minutes as indicated by the function detector/power assessor 78, the battery monitor 76 issues an advisory on the display 14 as in FIG. 2B, for example.

Figure 4:
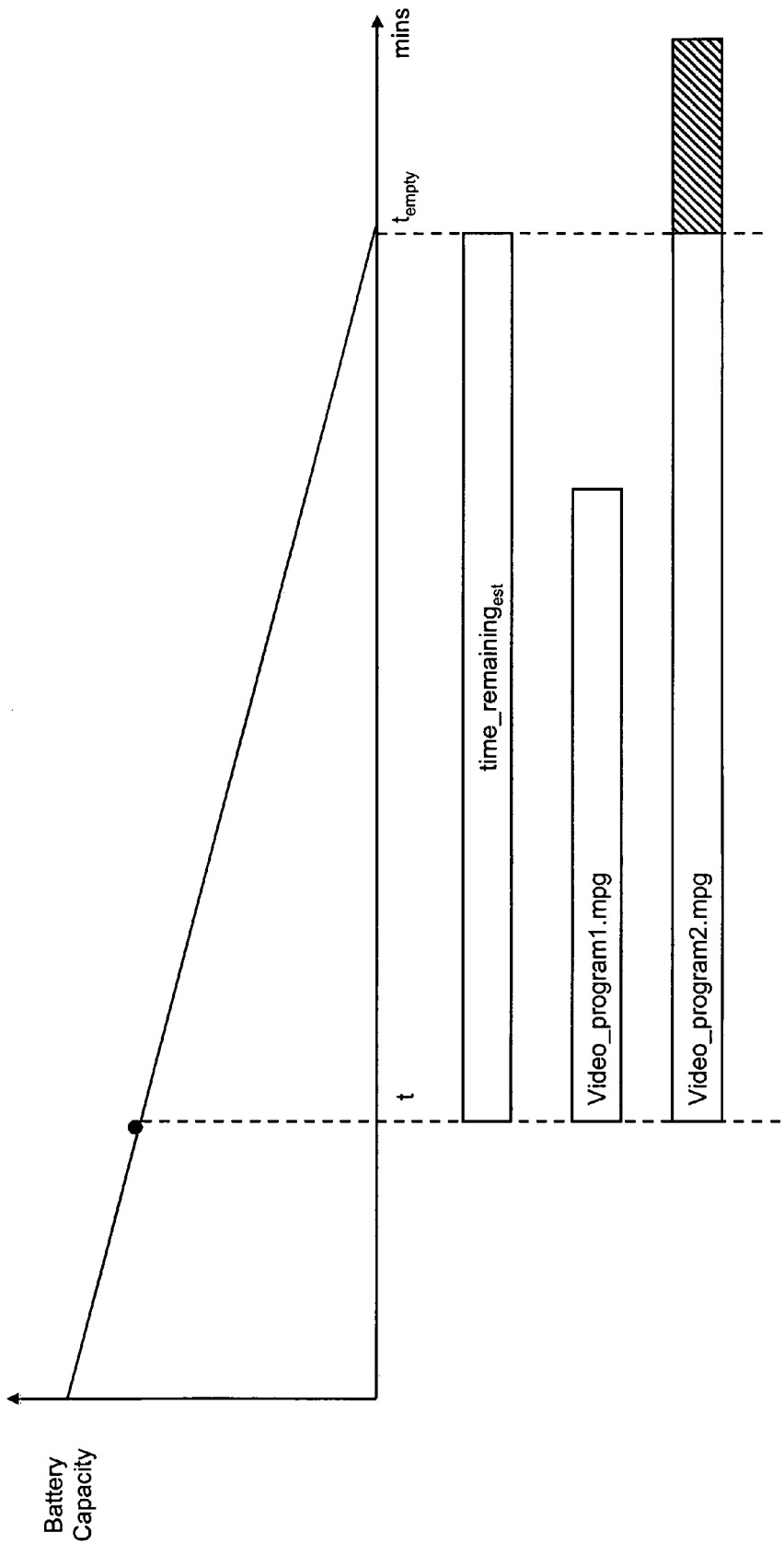
FIG. 4 graphically represents an instance where a battery advisory would not be issued, and an instance where a battery advisory would be issued, in accordance with an embodiment of the present invention.

Referring to FIG. 4, for example, assume that a user chooses to view a streamcast video beginning at time t. Although the discharge curve of the battery is represented as linear over time for sake of simplicity, it will be appreciated that the output of the battery monitor 76 may be indicative of an estimated time remaining of battery charge time_remaining$_{est}$ is equal to time $t_{empty}$ minus time t. In selecting the streamcast video according to known techniques as outlined above in relation to FIGS. 2A and 2B, the mobile telephone 10 receives information relating to the duration of the streamcast video and the encoding method, for example. The function detector/power consumption assessor 78 is configured to obtain such information from the beginning set up of the streamcast video and provide the information to the battery advisor 77. The battery advisor 77 in turn compares it to the estimated time remaining and provides an advisory as appropriate. In the example represented in FIG. 4, those having ordinary skill in the art will appreciate that if the user selects Video_program1.mpg having a duration less than ($t_{empty}$-t) the mobile phone 10 will be able to perform the selected function of viewing the streamcast video without running out of battery power. On the other hand, if the user selects Video_program2.mpg having a duration greater than ($t_{empty}$-t) the mobile phone 10 will not be able to perform the selected function of viewing the streamcast video in it's entirety before the batter runs out of charge.

Figure 5:
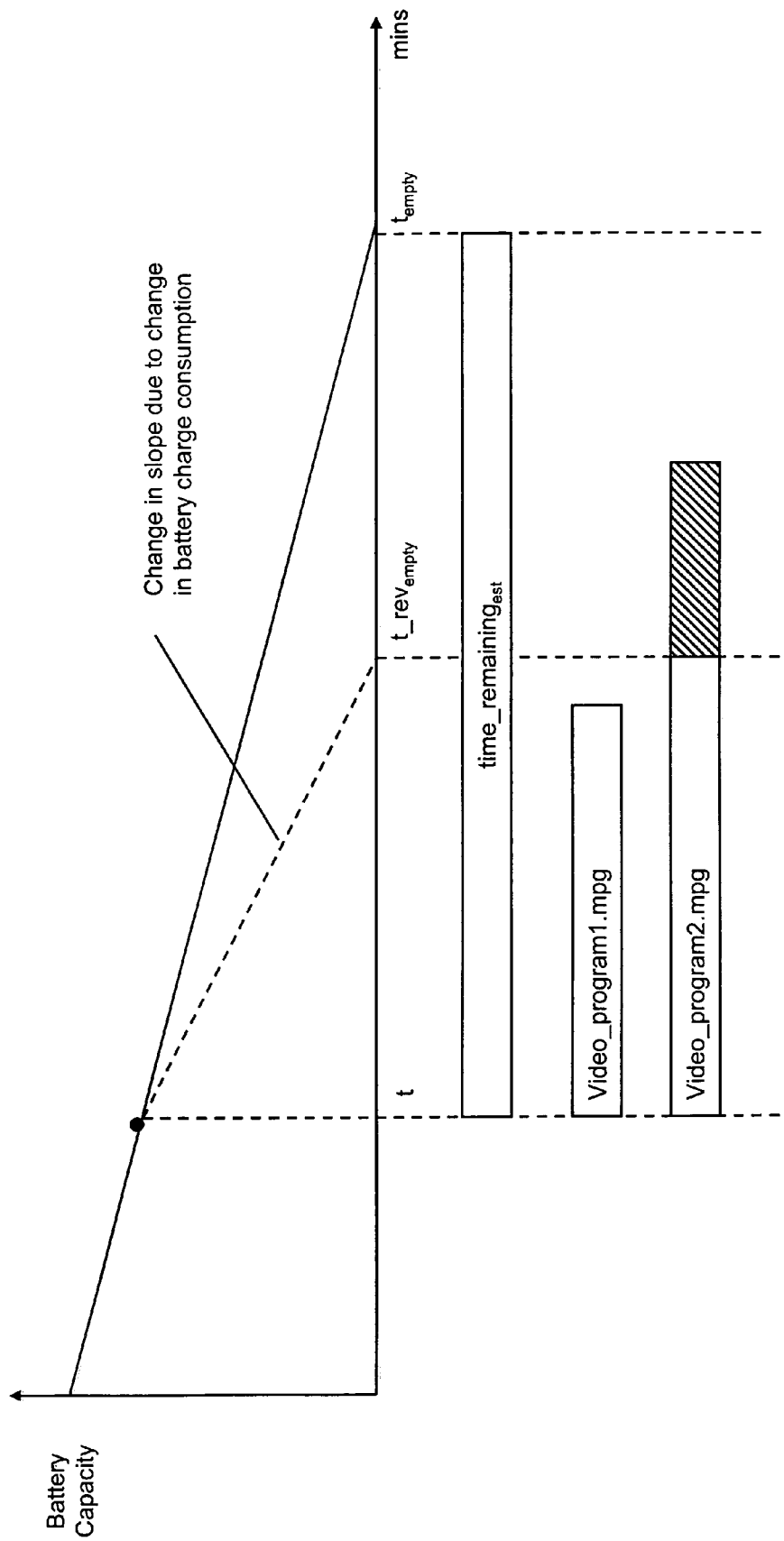
FIG. 5 graphically represents an instance where a battery advisory would not be issued, and an instance where a battery advisory would be issued, in accordance with another embodiment of the present invention.

FIG. 5 illustrates a more advanced embodiment of the mobile phone 10 in accordance with the present invention. In this embodiment, the function detector/power consumption assessor 78 takes into account a change in the rate of battery charge consumption in relation to the selected function. For example, FIG. 5 illustrates how the slope of the battery discharge curve with respect to time changes as a function of the additional battery charge consumption that will occur as a result of the mobile phone carrying out the specified function. As will be appreciated, some functions utilize more battery power than other functions. For example, functions involving rapidly changing graphics, many computations, etc., utilize more battery power than other more static functions such as word processing, etc. For example, receiving and decoding an mpeg type streamcast video may have a predetermined battery charge consumption rate. Further, it will be appreciated that receiving and decoding another type of streamcast video, e.g., a .wmv type file, may have a different predetermined battery charge consumption rate, each of which are stored in the memory 44.

In the embodiment of FIG. 5, the function detector/power consumption assessor 78 may be configured to combine the average or specified duration of the specified function together with the charge consumption rate of the specified function such that the information is provided to the battery advisor 77. Then, rather than simply compare the average or specified duration with the time remaining estimate from the battery monitor 76, a more accurate advisory can be provided by the battery advisor 77 based on a comparison of the charge consumption of the specified function with the amount of charge remaining in the battery. In such case, the battery monitor 76 can take into account both the charge consumption of the specified function to be performed along with the charge consumption of any overhead current drain on the battery due to any other functions, etc. that may be consuming charge concurrently.

Those having ordinary skill in the art will appreciate that the battery monitor 76 can be configured to provide an advisory based on a wide variety of types of comparisons of one or more different charge consumption characteristics. In the broadest sense, the present invention is not intended to be limited to any specific type of comparison.

Figure 6:
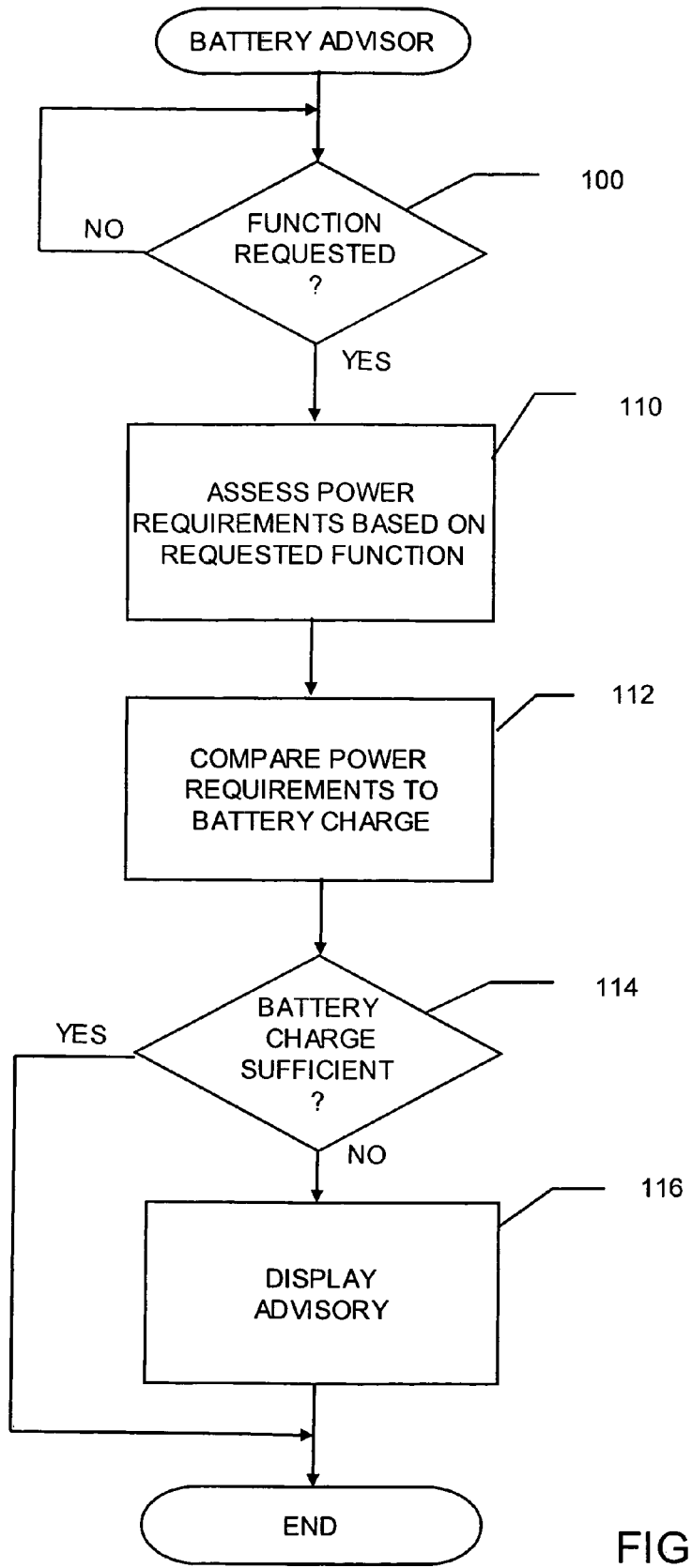
FIG. 6 is an exemplary flowchart suitable for programming the electronic equipment to provide a dynamic battery advisor in accordance with an embodiment of the present invention.

Referring now to FIG. 6, a flowchart is shown illustrating the basic operations of the present invention. Beginning in step 100, the function detector/power consumption assessor 78 determines if the user has requested that a function be performed. Again, the function can be any of a variety of functions which may be performed by the circuitry within the mobile phone 10. The requested function may be any function, including but not limited to, watching a streamcast video, watching a video stored in memory 44, making a call, listening to streamcast audio, listening to audio stored in the memory 44, capturing a video segment using the camera within the mobile phone 10, playing a game on the mobile phone 10, etc. The function detector/power consumption assessor 78 determines if the user has requested that a function be performed by, for example, detecting a sequence of key operations input by the user on the keypad 16 indicative of the request of a specific function. In addition, or in the alternative, the control circuit 40 may simply be configured to notify the function detector/power consumption assessor 78 when a particular function has been requested by the user or otherwise.

If the function detector/power consumption assessor 78 does not detect a function being requested in step 100, the mobile phone 10 continues to loop around step 100 as shown. In the event the function detector/power consumption assessor 78 does detect a function being requested in step 100, the mobile phone 10 continues to step 110. The function detector/power consumption assessor 78 in step 110 assesses the power consumption requirements of the mobile phone 10 in order to carry out the requested function. As explained above, the power consumption requirements may be based on a variety of different power consumption characteristics associated with the specific requested function. The power consumption characteristics may be based on the duration of the requested function, charge consumption rate, total charge consumption, etc. These values may be stored in the memory 44 and accessed by the function detector/power consumption assessor 78 based on the determined requested function. Alternatively, the values may be provided as part of the particular data utilized for carrying out the requested function (e.g., duration and encoding type information included in the media files requested to be reproduced). The values may be actual values, or values based on averages or other calculations performed by the function detector/power consumption assessor 78 each time a specific function is requested as discussed above.

Following step 110, the battery advisor 77 in step 112 compares the power consumption requirements provided by the function detector/power consumption assessor 78 with the available battery charge as provided by the battery monitor 76. Based on the comparison in step 112, the battery advisor 77 in step 114 determines if the battery charge of the battery 74 is sufficient to satisfy the power consumption requirements of the selected function. The battery advisor 77 can be configured to make such determination using the techniques described above in relation to FIGS. 4 and 5, or by using other techniques without departing from the broad scope of the invention.

If in step 114 the battery advisor 77 determines that the battery charge in the battery 74 is not sufficient, the battery advisor 77 in step 116 provides a recommendation indicative of the same such as the display shown in FIG. 2B. However, it will be appreciated that some other type display or indication my be provided without departing from the scope of the invention. Following step 116, the user may then choose whether to proceed with the requested function. On the other hand, if the battery advisor 77 in step 114 determines that the battery charge is sufficient, the battery advisor 77 skips the display advisory in step 116 so as to indicate that there is sufficient battery charge. Alternatively, the battery advisor 77 may display an indication that the battery charge is sufficient to carry out the requested function. Thereafter, the requested function may proceed.

In view of the above, those having ordinary skill in the art will appreciate that the present invention provides a battery monitor that reduces or avoids the risk of a user overestimating the remaining operating time based on a displayed level of battery charge. Moreover, the present invention provides a battery monitor that reduces or avoids the risk of a mobile phone, portable computer, or other type of electronic equipment running out of battery power before the completion of a function (e.g., the viewing of a streamcast video).

Although the invention has been shown and described with respect to certain preferred embodiments, it is obvious that equivalents and modifications will occur to others skilled in the art upon the reading and understanding of the specification. The present invention includes all such equivalents and modifications, and is limited only by the scope of the following claims.

The invention claim is:

1. An electronic equipment, comprising:
   a battery;

function circuitry that carries out one or more functions using power drawn from the battery;

a power assessment circuit that assesses power requirements of the function circuitry in relation to a function specified to be performed from among the one or more functions, wherein the power assessment circuit assesses the power requirements of the specified function by predicting a power consumption characteristic for completing the specified function;

wherein the power consumption characteristic is based on empirical data computed by the power assessment circuit;

a battery monitor circuit that monitors power available from the battery; and a battery advisor circuit, operatively coupled to the power assessment circuit and the battery monitor circuit, that provides a recommendation indicative of whether the power available from the battery is sufficient for the function circuitry to carry out the specified function.

2. The electronic equipment of claim 1, wherein the predicted power consumption characteristic is an estimated time duration.

3. The electronic equipment of claim 2, wherein the time duration is estimated based on an evaluation of past time durations of same or similar functions with respect to the specified function.

4. The electronic equipment of claim 3, wherein the evaluation comprises averaging the past time durations of the same or similar functions.

5. The electronic equipment of claim 1, wherein the predicted power consumption characteristic comprises an estimated power consumption rate.

6. The electronic equipment of claim 5, wherein the estimated power consumption rate is estimated based on an evaluation of past power consumption rates of same or similar functions with respect to the specified function.

7. The electronic equipment of claim 6, wherein the evaluation comprises averaging the past power consumption rates of the same or similar functions.

8. The electronic equipment of claim 1, wherein the predicted power consumption characteristic comprises an estimated power consumption.

9. The electronic equipment of claim 8, wherein the estimated power consumption is estimated based on an evaluation of past power consumption of same or similar functions with respect to the specified function.

10. The electronic equipment of claim 9, wherein the evaluation comprises averaging past power consumption of the same or similar functions.

11. The electronic equipment of claim 1, further comprising a memory for storing the predicted power consumption characteristic information in relation to the one or more functions.

12. The electronic equipment of claim 1, wherein the specified function comprises streaming a video file.

13. The electronic equipment of claim 12, wherein the power assessment circuit assesses the power requirements of the function circuitry in relation to streaming the video file based on time duration information provided with the streaming video file.

14. The electronic equipment of claim 13, wherein the power assessment circuit assesses the power requirements of the function circuitry in relation to streaming the video file based further on predicted power consumption rate information associated with the function circuitry when streaming video files.

15. The electronic equipment of claim 1, wherein the specified function comprises streaming an audio file.

16. The electronic equipment of claim 1, wherein the specified function comprises capturing video.

17. The electronic equipment of claim 1, wherein the specified function comprises providing real-time game play.

18. The electronic equipment of claim 1, wherein the electronic equipment is a mobile phone.

* * * * *

UNITED STATES PATENT AND TRADEMARK OFFICE
CERTIFICATE OF CORRECTION

| | | |
|---|---|---|
| PATENT NO. | : 7,600,139 B2 | Page 1 of 1 |
| APPLICATION NO. | : 11/387462 | |
| DATED | : October 6, 2009 | |
| INVENTOR(S) | : John Eric Ang | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 665 days.

Signed and Sealed this

Fifth Day of October, 2010

David J. Kappos
*Director of the United States Patent and Trademark Office*